United States Patent
Conway

(10) Patent No.: US 7,149,093 B2
(45) Date of Patent: Dec. 12, 2006

(54) PXI CHASSIS WITH BACKWARDS COMPATIBILITY FOR EXISTING PXI DEVICES

(75) Inventor: Craig M. Conway, Leander, TX (US)

(73) Assignee: National Instruments Corporation, Austin, TX (US)

( * ) Notice: Subject to any disclaimer, the term of this patent is extended or adjusted under 35 U.S.C. 154(b) by 193 days.

(21) Appl. No.: 10/410,092

(22) Filed: Apr. 9, 2003

(65) Prior Publication Data
US 2004/0201956 A1   Oct. 14, 2004

(51) Int. Cl.
H01R 12/16 (2006.01)

(52) U.S. Cl. .................. 361/788; 361/760; 361/686; 361/792

(58) Field of Classification Search ................ 361/686, 361/760, 810, 807, 788, 792, 802, 784
See application file for complete search history.

(56) References Cited

U.S. PATENT DOCUMENTS

| | | | | |
|---|---|---|---|---|
| 4,784,609 A | * | 11/1988 | Lau | 439/56 |
| 5,162,675 A | * | 11/1992 | Olsen et al. | 326/37 |
| 5,273,463 A | * | 12/1993 | Kaetsu et al. | 439/681 |
| D354,940 S | * | 1/1995 | Speiser et al. | D13/133 |
| 5,448,699 A | | 9/1995 | Goss et al. | |
| 5,576,935 A | * | 11/1996 | Freer et al. | 361/785 |
| 5,628,637 A | * | 5/1997 | Pecone et al. | 439/74 |
| 5,648,891 A | | 7/1997 | Gierut | |
| 5,995,376 A | | 11/1999 | Schultz et al. | |
| 6,008,995 A | * | 12/1999 | Pusateri et al. | 361/796 |
| 6,038,138 A | | 3/2000 | Dayton et al. | |
| 6,075,704 A | | 6/2000 | Amberg et al. | |
| 6,166,917 A | * | 12/2000 | Anderson | 361/756 |
| 6,195,262 B1 | | 2/2001 | Bodette et al. | |
| 6,198,633 B1 | | 3/2001 | Lehman et al. | |
| 6,256,208 B1 | * | 7/2001 | Supinski et al. | 361/784 |
| 6,328,598 B1 | * | 12/2001 | Harris, Jr. | 439/516 |
| 6,422,876 B1 | | 7/2002 | Fitzgerald et al. | |
| 6,608,755 B1 | | 8/2003 | Baldwin et al. | |
| 6,625,033 B1 | * | 9/2003 | Steinman | 361/753 |
| 6,662,255 B1 | * | 12/2003 | Klein | 710/301 |
| 6,850,409 B1 | * | 2/2005 | Triebes et al. | 361/684 |
| 2002/0135987 A1 | * | 9/2002 | Baldwin et al. | 361/730 |

OTHER PUBLICATIONS

Rittal Product Sheet for Ripac "Perfect Handling" pp. 17-26. Undated.

* cited by examiner

Primary Examiner—Elvin Enad
Assistant Examiner—Hung S. Bui
(74) Attorney, Agent, or Firm—Meyertons Hood Kivlin Kowert & Goetzel, P.C.; Jeffrey C. Hood; Russell E. Henrichs

(57) ABSTRACT

The coupling apparatus couples two circuit cards to fit into a larger chassis. A coupling element can connect two similar sized circuit cards or two different sized circuit cards together by coupling the first circuit card and the second circuit card to effectively form a combined circuit card of a larger size. The larger size may allow for more features, may make it easier to dissipate heat, may make the circuit cards easier to shield, and/or may allow for the use of larger and less expensive components on the circuit cards.

42 Claims, 3 Drawing Sheets

PXI CHASSIS WITH BACKWARDS COMPATIBILITY FOR EXISTING PXI DEVICES

FIELD OF THE INVENTION

The present invention relates to an adapter for coupling two cards of one size to create a combined card of a second size, and more specifically to create a combined card in a CompactPCI/PXI form factor.

DESCRIPTION OF THE RELATED ART

An instrument is a device which collects data or information from an environment or unit under test and displays this information to a user. An instrument may also perform various data analysis and data processing on acquired data prior to displaying the data to the user. Examples of various types of instruments include oscilloscopes, digital multimeters, pressure sensors, etc., and the types of information which might be collected by respective instruments include voltage, resistance, distance, velocity, pressure, frequency of oscillation, humidity or temperature, among others.

The various hardware interface options currently available for instrumentation systems can be categorized into various types, including IEEE 488-controlled instruments (GPIB instruments), Virtual Machine Environment (VME) Extensions for Instrumentation (VXI) bus instruments, Peripheral Component Interconnect (PCI) Extensions for Instrumentation (PXI) bus instruments, plug-in data acquisition (DAQ) boards, and RS-232-controlled (serial) instruments, among others.

The PXI bus is a platform for instrumentation systems that was introduced in 1997. PXI combines the high-speed PCI bus with integrated timing and triggering designed specifically for measurement and automation applications to deliver significant performance improvements over older architectures. PXI is built on the modular and scalable CompactPCI specification and the high-speed PCI bus architecture. As a result, PXI products maintain complete interoperability with CompactPCI, offering superior mechanical integrity, easy systems integration, and more expansion slots than desktop computers.

FIG. 1 (Related Art) Exemplary Chassis

FIG. 1 illustrates an exemplary chassis of either VXI, VME, CompactPCI, or PXI type. Cards 102A, 102B, and 102C are designed to physically connect with the chassis backplane (not shown). The chassis 100 comprises a housing which is configured to define a plurality of slots. The backplane is comprised in the housing and is adapted for transmitting electrical signals. Cards 102A, 102B, and 102C can be of either 3U or 6U size, such as described below with reference to FIG. 2.

FIG. 2 (Related Art) Various Card Formats

FIG. 2 illustrates different card formats as defined by the IEEE 1101.10, CompactPCI, and PXI specifications. The IEEE 1101.10, CompactPCI, and PXI specifications define two card sizes, referred to as 3U and 6U, and two chassis sizes, referred to as 3U and 6U, designed to accept 3U and 6U cards, respectively. The IEEE 1101.10, CompactPCI, and PXI specification define 6U card size to be more than twice as tall as the 3U card size.

Since there are different chassis sizes and different card sizes, it would be advantageous to allow different sized cards to fit into different sized chassis. For example, related art such as Front Panel Adapter, PN# 3687098 and PN# 3687471 from Rittal may allow users to connect two 3U cards into a single 6U slot in a 6U chassis. However, Rittal and related solutions may require a pre-defined set of mounting holes on the cards 102A, 102B, and 102C in order to use the adapter. The pre-defined holes may not be universal to all CompactPCI cards 102A, 102B, and 102C, thus making the adapter difficult to utilize properly. Other related art includes solutions for a 6U chassis with a pre-defined number of 3U slots, such as products from Adlink, Ziatech, and Diversified Technologies.

SUMMARY OF THE INVENTION

In one embodiment, a first module and a second module may be combined using a coupling element to provide a larger circuit area. For example, the first module and the second module may have similar circuit areas and coupling the first module to the second module may provide double the circuit area as provided by either the first module or the second module. In another embodiment, the first module may be larger than the second module. Other module sizes are also contemplated.

In one embodiment, the first module may be an adapter card such as, but not limited to a Riser Card with a PCI Express to PCI Bridge. In one embodiment, the PCI Express to PCI Bridge may convert a PCI Express signal to a PCI signal. The first module may also pass along PXI-specific trigger and clocking signals and provide additional depth to interface a Legacy PXI card to a PCI Express backplane.

BRIEF DESCRIPTION OF THE DRAWINGS

A better understanding of the present invention can be obtained when the following detailed description of the preferred embodiment is considered in conjunction with the following drawings, in which.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

DETAILED DESCRIPTION OF THE PREFERRED EMBODIMENT

Incorporation by Reference

U.S. Pat. No. 5,995,376 titled "Chassis which includes configurable slot 0 locations" filed May 20, 1997, is hereby incorporated by reference as though fully and completely set forth herein.

U.S. Pat. No. 6,198,633 B1 titled "Computer system and enclosure thereof" filed Jul. 17, 1998, is hereby incorporated by reference as though fully and completely set forth herein.

Figure 1:
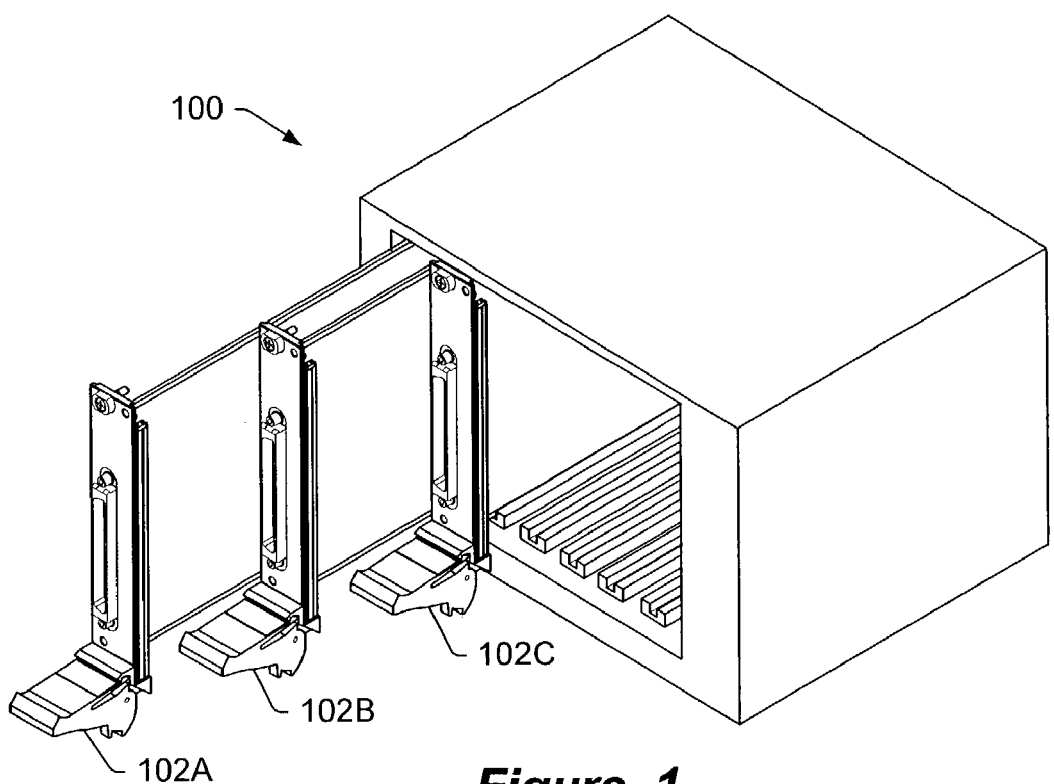
FIG. 1 illustrates a prior art chassis of VXI/VME/CompactPCI/PXI type.
Figure 2:
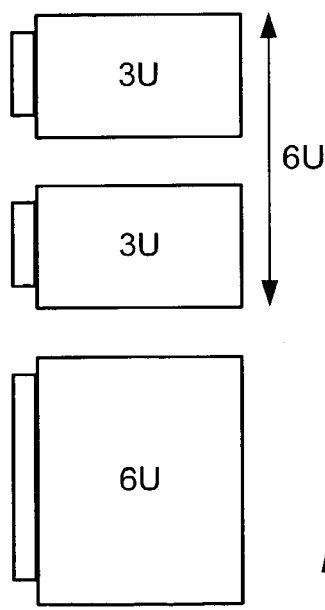
FIG. 2 illustrates prior art various card formats.
Figure 3:
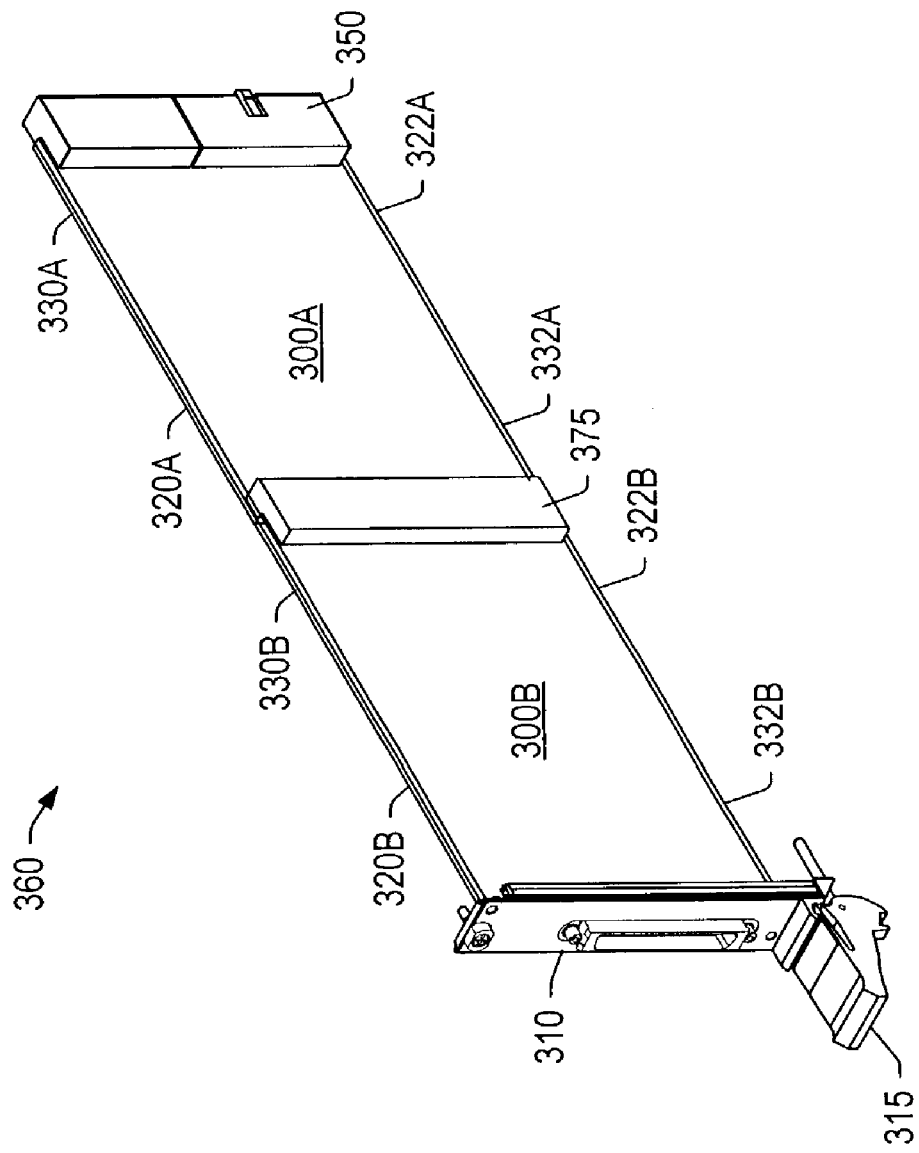
FIG. 3 illustrates an exemplary embodiment of the apparatus, according to one embodiment.

FIG. 3—Exemplary embodiment of the apparatus

FIG. 3 illustrates an exemplary embodiment of an apparatus for coupling a first module 300A to a second module 300B to form a combined module 360. For example, the first module 300A may be an adapter card such as, but not limited to a PXI Riser Card with an incorporated PCI Express to PCI Bridge. For example, the PXI Riser Card may work with the interface described in U.S. patent application Ser. No. 10/014,638 titled "Instrumentation System Including a Backplane Having a Switched Fabric Bus and Instrumentation Lines", which was filed Oct. 26, 2001, whose inventors are Mark Wetzel, Michel Haddad, Joseph E. Peck, and Christopher A. Clark, and which issued on Dec. 27, 2005 as U.S. Pat. No. 6,981,086, which is hereby incorporated by reference in its entirety as though fully and completely set forth herein. U.S. Pat. No. 6,981,086 discloses a backplane having a switched fabric bus (such as PCI Express) and instrumentation lines. In one embodiment, the adaptor card may have an incorporated PCI to PCI Express Bridge. In yet another embodiment, the adaptor card may have an incorporated PCI Express to PCI-X Bridge. In one embodiment, the PCI Express to PCI Bridge may convert a PCI Express signal to a PCI signal. The first module 300A may also pass along PXI-specific trigger signals and clocking signals and provide additional depth to interface a Legacy PXI card to a PCI Express backplane. In one embodiment, the PCI Express backplane may use a PCI Express communication protocol. In one embodiment, the backplane may use a PCI communication protocol. A PCI Express interface used with the backplane may have a reduced pin count compared to a PCI interface used wit the backplane.

In one embodiment, the second module 300B may be a Legacy PXI Card. In one embodiment, the second module 300B may have a front face 310, while the first module 300A may have a back face 350. In one embodiment, the front face 310 may provide an interface between the second module and an external component such as, but not limited to, a peripheral device. The back face 350 may have one or more connectors for coupling to a chassis 100. The first module 300A and the second module 300B each may have a first lateral edge 320A and 320B respectively. The first lateral edge 320A and 320B may each have a first keep-out region 330A and 330B respectively which together may extend at least a portion of the distance from the front face 310 to the back face 350.

The first module 300A and the second module 300B may each have a second lateral edge 322A and 322B respectively. The second lateral edge 322A and 322B may be located opposite to the first lateral edge 320A and 320B respectively. The second lateral edge 322A and 322B may each have a second keep-out region 332A and 332B respectively, which together may extend at least a portion of the distance from the front face 310 to the back face 350. Also, in one embodiment, the second module 300B may have at least one injector/ejector lever 315. The injector/ejector lever 315 may be operable to inject/eject a module 300A, 300B, and/or 360 into/out of a chassis 100.

In one embodiment, the apparatus may have one or more coupling elements 375 operable to couple the first module 300A and the second module 300B. In one embodiment, the coupling element 375 may be a PXI Connector. A combined module 360 may be formed by coupling the first module 300A to the second module 300B. In one embodiment, each of the first module 300A and the second module 300B may have a similar size or a different size. The combined size of both the first module 300A and the second module 300B may provide a larger circuit area. In one embodiment, the larger circuit area may be provided while maintaining a PCI-Express standard communication protocol.

In one embodiment, the combined module 360 may be operable to be inserted into a slot in the chassis 100. In one embodiment, the chassis 100 may have one or more slots each operable to receive a module 360 with a larger circuit area than a traditional 3U card.

Figure 4:
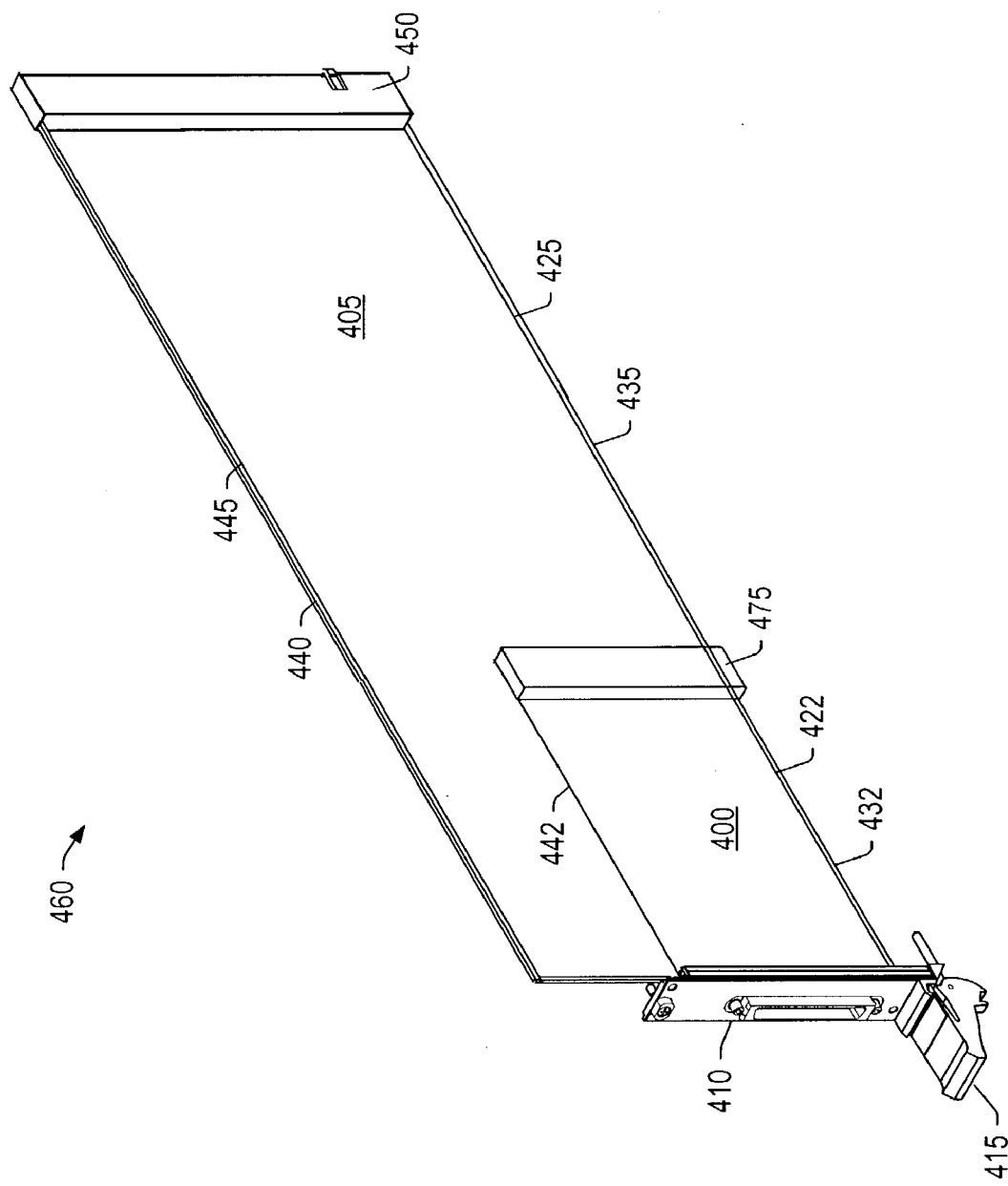
FIG. 4 illustrates another exemplary embodiment of the apparatus, according to one embodiment.

FIG. 4—Exemplary Embodiment of the Apparatus

FIG. 4 illustrates an exemplary embodiment of an apparatus for coupling a first extended module 405 to a second module 400 to form a combined module 460. In one embodiment, the first extended module 405 may be a carrier module with an incorporated PCI Express to PCI Bridge. In one embodiment, the second module 400 may be a Legacy PXI Card. In one embodiment, the second module 400 may have a front face 410, while the first extended module 405 may have a back face 450. In one embodiment, the front face 410 may be coupled to both the first extended module 405 and the second module 400. The back face 450 may have one or more connectors for coupling to a chassis 100. The first extended module 405 and the second module 400 may each have a first lateral edge 440 and 442 respectively. The first lateral edge 440 may have a first keep-out region 445, and the second lateral edge 442 may have a first keep-out region (not shown), which together may extend at least a portion of the distance from the front face 410 to the back face 450. In one embodiment, the first keep-out region 445 may extend between the front face 410 and the back face 450.

The first extended module 405 and the second module 400 may each have a second lateral edge 425 and 422 respectively. The second lateral edges 425 and 422 may each be located opposite to the first lateral edges 440 and 442 respectively. The second lateral edge 425 and 422 may each have a second keep-out region 435 and 432 respectively, which together may extend at least a portion of the distance from the front face 410 to the back face 450. Also, in one embodiment, the first extended module 405 may comprise at least one injector/ejector lever 415. The injector/ejector lever 415 may be operable to inject/eject a module 405, 400, and/or 460 into/out of a chassis 100.

In one embodiment, the apparatus may have one or more coupling elements 475 operable to couple the first extended module 405 and the second module 400. In one embodiment, the coupling element 475 may be a PXI Connector. A combined module 460 may be formed by coupling the first extended module 405 to the second module 400 to provide a greater circuit area. In one embodiment, the combined module 460 may be operable to be inserted into a slot in the chassis 100. In one embodiment, the chassis 100 may have one or more slots each operable to receive a module 460. In one embodiment, the first extended module 405 may have a greater height and width than the second module 400. The first extended module 405 may be used to allow the second module 400 to fit in a larger chassis. The second module 400 may have a height approximately equal to 3U. Other module sizes are also contemplated.

Numerous variations and modifications will become apparent to those skilled in art once the above disclosure is fully appreciated. It is intended that the following claims be interpreted to embrace all such variations and modifications.

What is claimed is:

1. An apparatus, comprising:
 a legacy peripheral component interconnect extensions for instrumentation (PXI) card, wherein the legacy PXI card is designed for insertion into a legacy PXI chassis, and wherein the legacy PXI comprises:
  a legacy PXI front face, operable to provide an interface between the legacy PXI card and an external component; and a legacy PXI back face, operable to provide an interface between the legacy PXI and a backplane of the legacy PXI chassis, wherein the legacy PXI back face is substantially parallel to the legacy PXI front face; and an extender card, wherein the extender card comprises:
an extender card front face, operable to couple to the legacy PXI back face to provide an interface between the extender card and the legacy PXI card; and an extender card back face, operable to provide an interface between the extender card and a PXI Express backplane of a first chassis, wherein the extender card front face and the extender card back face are substantially parallel, and wherein the first chassis is larger than the legacy PXI chassis;

wherein the extender card is operable to:
extend the legacy PXI card on two sides or less of the legacy PXI card to fit and operate in the first chassis; and convert between a legacy PXI communication protocol and a PXI Express communication protocol;

wherein, when coupled, the extender card and the legacy PXI card are substantially coplanar and form a combined card which is insertable into the first chassis.

2. The apparatus of claim 1, wherein the combined card does not comprise additional perimeter elements for structural support.

3. The apparatus of claim 1, wherein the extender card is a PXI riser card.

4. The apparatus of claim 1, wherein the extender card is a PXI carrier module.

5. The apparatus of claim 1, wherein the extender card further comprises a PCI Express to PCI bridge, operable to convert PCI Express signals to PCI signals.

6. The apparatus of claim 1, wherein the extender card further comprises a PCI to PCI Express bridge, operable to convert PCI signals to PCI Express signals.

7. The apparatus of claim 1, wherein the extender card further comprises a PCI Express to PCI extended (PCI-X) bridge, operable to convert PCI Express signals to PCI-X signals.

8. The apparatus of claim 1, wherein at least two dimensions of the extender card are greater than at least two corresponding dimensions of the second module.

9. The apparatus of claim 1,
wherein a height of the extender card is greater than a height of the legacy PXI card;
wherein the height of the extender card and the height of the legacy PXI card are substantially parallel.

10. The apparatus of claim 1,
wherein a length of the extender card is greater than a length of the legacy PXI card;
wherein the length of the first module and the length of the second module are substantially parallel.

11. The apparatus of claim 1, wherein the extender card comprises an overlapping portion that is coplanar with the legacy PXI card and substantially extends to the legacy PXI front face.

12. A PXI riser card comprising:
a front portion, operable to couple to a legacy PXI card to provide an interface between the legacy PXI card and an external component, wherein the legacy PXI card is designed to be insertable and operable in a legacy PXI chassis; and
a back portion, operable to couple to a PXI Express backplane of a first chassis, wherein the first chassis is larger than the legacy PXI chassis;

wherein the PXI riser card is operable to couple substantially coplanar to the legacy PXI card via a PXI connector to form a combined card, wherein the combined card is insertable into the first chassis, wherein the PXI riser card is operable to convert between a legacy PXI communication protocol and a PXI Express communication protocol, and wherein the PXI riser card is operable to extend the legacy PXI card on two sides or less of the legacy PXI card to fit and operate in the first chassis.

13. The PXI riser card of claim 12, wherein at least two dimensions of the PXI riser card are greater than at least two corresponding dimensions of the legacy PXI card.

14. The PXI riser card of claim 12, wherein at least one dimension of the PXI riser card is greater than at least one corresponding dimension of the legacy PXI card.

15. The PXI riser card of claim 12, wherein the PXI riser card includes a PCI Express to PCI bridge.

16. The PXI riser card of claim 12, wherein the PXI riser card comprises a PCI to PCI Express bridge.

17. An apparatus, comprising:
a legacy PXI card, insertable and operable in a legacy PXI chassis;
a PXI riser card, coupled substantially coplanar to the legacy PXI card via a PXI connector to form a combined card, wherein the combined card is insertable into a first chassis which is larger than the legacy PXI chassis, wherein the first chassis has a PXI Express backplane, wherein the PXI carrier module is operable to convert between a legacy PXI communication protocol and a PXI Express communication protocol, and wherein the PXI carrier module is operable to extend the legacy PXI card on two sides or less of the legacy PXI card to fit and operate in the first chassis;
wherein the combined card comprises a front face operable to provide an interface between the legacy PXI card and an external component; and
wherein the combined card comprises a back face operable to provide an interface between the PXI carrier module and the PXI Express backplane.

18. The apparatus of claim 17, wherein at least two dimensions of the PXI carrier module are greater than at least two corresponding dimensions of the legacy PXI card.

19. The apparatus of claim 17, wherein at least one dimension of the PXI riser card is greater than at least one corresponding dimension of the legacy PXI card.

20. The apparatus of claim 17, wherein the PXI carrier module includes a PCI Express to PCI bridge.

21. The apparatus of claim 17, wherein the PXI carrier module comprises an overlapping portion that is coplanar with the legacy PXI card and substantially extends to the front face.

22. An apparatus, comprising:
a legacy peripheral component interconnect extensions for instrumentation (PXI) card, wherein the legacy PXI card is designed for insertion into a legacy PXI chassis, and wherein the legacy PXI comprises:
a legacy PXI front face, operable to provide an interface between the legacy PXI card and an external component; and
a legacy PXI back face, operable to provide an interface between the legacy PXI and a backplane of the legacy PXI chassis, wherein the legacy PXI back face is substantially parallel to the legacy PXI front face; and an extender card, wherein the extender card comprises:

an extender card front face, operable to couple to the legacy PXI back face to provide an interface between the extender card and the legacy PXI card; and an extender card back face, operable to provide an interface between the extender card and a PCI Express backplane of a first chassis, wherein the extender card front face and the extender card back face are substantially parallel, and wherein the first chassis is larger than the legacy PXI chassis;

wherein the extender card is operable to:

extend the legacy PXI card on two sides or less of the legacy PXI card to fit and operate in the first chassis; and convert between a legacy PXI communication protocol and a PCI Express communication protocol;

wherein, when coupled, the extender card and the legacy PXI card are substantially coplanar and form a combined card which is insertable into the first chassis.

23. The apparatus of claim 22, wherein the combined card does not comprise additional perimeter elements for structural support.

24. The apparatus of claim 22, wherein the extender card is a PXI riser card.

25. The apparatus of claim 22, wherein the extender card is a PXI carrier module.

26. The apparatus of claim 22, wherein the extender card further comprises a PCI Express to PCI bridge, operable to convert PCI Express signals to PCI signals.

27. The apparatus of claim 22, wherein the extender card further comprises a PCI to PCI Express bridge, operable to convert PCI signals to PCI Express signals.

28. The apparatus of claim 22, wherein the extender card further comprises a PCI Express to PCI extended (PCI-X) bridge, operable to convert PCI Express signals to PCI-X signals.

29. The apparatus of claim 22, wherein at least two dimensions of the extender card are greater than at least two corresponding dimensions of the second module.

30. The apparatus of claim 22, wherein a height of the extender card is greater than a height of the legacy PXI card;

wherein the height of the extender card and the height of the legacy PXI card are substantially parallel.

31. The apparatus of claim 22, wherein a length of the extender card is greater than a length of the legacy PXI card;

wherein the length of the first module and the length of the second module are substantially parallel.

32. The apparatus of claim 22, wherein the extender card comprises an overlapping portion that is coplanar with the legacy PXI card and substantially extends to the legacy PXI front face.

33. A PXI riser card comprising:

a front portion, operable to couple to a legacy PXI card to provide an interface between the legacy PXI card and an external component, wherein the legacy PXI card is designed to be insertable and operable in a legacy PXI chassis; and a back portion, operable to couple to a PCI Express backplane of a first chassis, wherein the first chassis is larger than the legacy PXI chassis, wherein the PXI riser card is operable to couple substantially coplanar to the legacy PXI card via a PXI connector to form a combined card, wherein the combined card is inset-table into the first chassis, wherein the PXI riser card is operable to convert between a legacy PXI communication protocol and a PCI Express communication protocol, and wherein the PXI riser card is operable to extend the legacy PXI card on two sides or less of the legacy PXI card to fit and operate in the first chassis.

34. The PXI riser card of claim 33, wherein at least two dimensions of the PXI riser card are greater than at least two corresponding dimensions of the legacy PXI card.

35. The PXI riser card of claim 33, wherein at least one dimension of the PXI riser card is greater than at least one corresponding dimension of the legacy PXI card.

36. The PXI riser card of claim 33, wherein the PXI riser card includes a PCI Express to PCI bridge.

37. The PXI riser card of claim 33, wherein the PXI riser card comprises a PCI to PCI Express bridge.

38. An apparatus, comprising:

a legacy PXI card, insertable and operable in a legacy PXI chassis;

a PXI riser card, coupled substantially coplanar to the legacy PXI card via a PXI connector to form a combined card, wherein the combined card is insertable into a first chassis which is larger than the legacy PXI chassis, wherein the first chassis has a PCI Express backplane, wherein the PXI carrier module is operable to convert between a legacy PXI communication protocol and a PCI Express communication protocol, and wherein the PXI carder module is operable to extend the legacy PXI card on two sides or less of the legacy PXI card to fit and operate in the first chassis;

wherein the combined card comprises a front face operable to provide an interface between the legacy PXI card and an external component; and wherein the combined card comprises a back face operable to provide an interface between the PXI carrier module and the PCI Express backplane.

39. The apparatus of claim 38, wherein at least two dimensions of the PXI carrier module are greater than at least two corresponding dimensions of the legacy PXI card.

40. The apparatus of claim 38, wherein at least one dimension of the PXI riser card is greater than at least one corresponding dimension of the legacy PXI card.

41. The apparatus of claim 38, wherein the PXI carrier module includes a PCI Express to PCI bridge.

42. The apparatus of claim 38, wherein the PXI carrier module comprises an overlapping portion that is coplanar with the legacy PXI card and substantially extends to the front face.

\* \* \* \* \*

UNITED STATES PATENT AND TRADEMARK OFFICE
CERTIFICATE OF CORRECTION

| | | |
|---|---|---|
| PATENT NO. | : 7,149,093 B2 | |
| APPLICATION NO. | : 10/410092 | |
| DATED | : December 12, 2006 | |
| INVENTOR(S) | : Conway | |

It is certified that error appears in the above-identified patent and that said Letters Patent is hereby corrected as shown below:

Column 8 Line 7, please delete "card is inset-table into the first" and substitute -- card is insertable into the first --.

Signed and Sealed this

Sixth Day of March, 2007

JON W. DUDAS
*Director of the United States Patent and Trademark Office*